US010323334B2

(12) United States Patent
Baba

(10) Patent No.: US 10,323,334 B2
(45) Date of Patent: Jun. 18, 2019

(54) METHOD FOR PRODUCING A QUARTZ GLASS CRUCIBLE HAVING A ROUGHENED INNER SURFACE REGION FOR PULLING SINGLE CRYSTAL SILICON

(71) Applicant: SHIN-ETSU QUARTZ PRODUCTS CO., LTD., Tokyo (JP)

(72) Inventor: Yuji Baba, Takefu (JP)

(73) Assignee: SHIN-ETSU QUARTZ PRODUCTS CO., LTD., Tokyo (JP)

(*) Notice: Subject to any disclaimer, the term of this patent is extended or adjusted under 35 U.S.C. 154(b) by 0 days.

(21) Appl. No.: 15/327,206

(22) PCT Filed: Jun. 1, 2015

(86) PCT No.: PCT/JP2015/002753
§ 371 (c)(1),
(2) Date: Jan. 18, 2017

(87) PCT Pub. No.: WO2016/017055
PCT Pub. Date: Feb. 4, 2016

(65) Prior Publication Data
US 2017/0175291 A1    Jun. 22, 2017

(30) Foreign Application Priority Data

Jul. 31, 2014    (JP) ................. 2014-155716

(51) Int. Cl.
*C30B 15/10*    (2006.01)
*C03C 19/00*    (2006.01)
(Continued)

(52) U.S. Cl.
CPC ............ *C30B 15/10* (2013.01); *C03B 19/095* (2013.01); *C03B 20/00* (2013.01); *C03B 32/02* (2013.01);
(Continued)

(58) Field of Classification Search
CPC ......... C30B 15/00; C30B 15/10; C30B 29/00; C30B 29/02; C30B 29/06; Y10T 117/00;
(Continued)

(56) References Cited

U.S. PATENT DOCUMENTS 4,010,064 A * 3/1977 Patrick .................... C30B 15/10
117/208
5,976,247 A    11/1999 Hansen et al.
(Continued)

FOREIGN PATENT DOCUMENTS

CN    1149634 A    5/1997
CN    101356130 A    1/2009
(Continued)

OTHER PUBLICATIONS

Aug. 25, 2015 Search Report issued in International Patent Application No. PCT/JP201/002753.
(Continued)

*Primary Examiner* — Kenneth A Bratland, Jr.
(74) *Attorney, Agent, or Firm* — Oliff PLC

(57) ABSTRACT

The present invention is a method for producing a quartz glass crucible for pulling a single crystal silicon from a silicon melt held therein, including the steps of: producing a quartz glass crucible having an outer layer including an opaque quartz glass containing bubbles therein and an inner layer including a transparent quartz glass containing substantially no bubbles; roughening a region of an inner surface of the produced quartz glass crucible, the region being in contact with the silicon melt when holding the silicon melt; and heating the quartz glass crucible having the roughened inner surface to crystallize a surface of the roughened region. This can produce a quartz glass crucible for pulling a single crystal silicon which can suppress generation of a brown ring on the inner surface of the (Continued)

crucible during pulling the single crystal silicon and can suppress crystallinity disorder of the single crystal silicon.

8 Claims, 2 Drawing Sheets

(51) Int. Cl.
    *C03B 20/00*      (2006.01)
    *C30B 29/06*      (2006.01)
    *C03B 19/09*      (2006.01)
    *C03B 32/02*      (2006.01)

(52) U.S. Cl.
    CPC .............. *C03C 19/00* (2013.01); *C30B 29/06* (2013.01); *Y02P 40/57* (2015.11)

(58) Field of Classification Search
    CPC ............ Y10T 117/10; Y10T 117/1024; Y10T 117/1032; C03B 19/00; C03B 19/095; C03B 20/00; C03B 32/02; F27B 14/00; F27B 14/08; F27B 14/10; F27B 14/102; F27B 14/104
    USPC .... 117/200, 206, 208, 928, 931–932, 4, 7–8
    See application file for complete search history.

(56) References Cited

U.S. PATENT DOCUMENTS

| | | | |
|---|---|---|---|
| 6,548,131 | B1 | 4/2003 | Fabian et al. |
| 2003/0012899 | A1 | 1/2003 | Kemmochi et al. |
| 2004/0187771 | A1* | 9/2004 | Tsuji ................. B24C 1/08 117/220 |
| 2006/0174651 | A1* | 8/2006 | Ohama .............. C03B 19/095 65/17.3 |
| 2007/0084397 | A1 | 4/2007 | Hansen et al. |
| 2007/0084400 | A1 | 4/2007 | Hansen et al. |
| 2007/0151504 | A1 | 7/2007 | Hansen et al. |
| 2008/0092804 | A1 | 4/2008 | Hansen et al. |
| 2012/0255487 | A1 | 10/2012 | Sudo et al. |
| 2014/0352605 | A1* | 12/2014 | Fallows ............... C30B 15/10 117/33 |

FOREIGN PATENT DOCUMENTS

| | | | | |
|---|---|---|---|---|
| EP | 2410081 | A1 | | 1/2012 |
| JP | 3046545 | B2 | | 5/2000 |
| JP | 2001-114590 | A | | 4/2001 |
| JP | 2004-155642 | A | | 6/2004 |
| JP | 2004155642 | A | * | 6/2004 .......... C03B 19/095 |
| JP | 4279015 | B2 | | 6/2009 |
| TW | 201131029 | A | | 9/2011 |
| WO | 2011/158712 | A1 | | 12/2011 |

OTHER PUBLICATIONS

Jan. 31, 2017 International Preliminary Report on Patentability issued in International Patent Application No. PCT/JP2015/002753.
Feb. 20, 2018 Extended European Search Report issued in European Patent Application No. 15827320.1.
Jan. 9, 2018 Office Action issued in Japanese Patent Application No. 2014-155716.
Aug. 13, 2018 Office Action issued in Chinese Patent Application No. 201580041344.X.
Nov. 2, 2018 Office Action issued in Taiwanese Patent Application No. 104119133.
Dec. 14, 2018 Office Action issued in Chinese Patent Application No. 201580041344.
Apr. 23, 2019 Office Action issued in Chinese Patent Application No. 201580041344.X.

* cited by examiner

[FIG. 1]
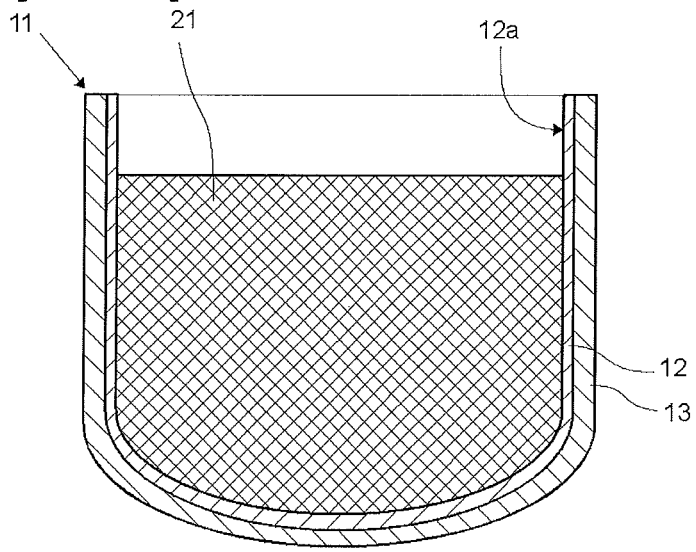
[FIG. 2]
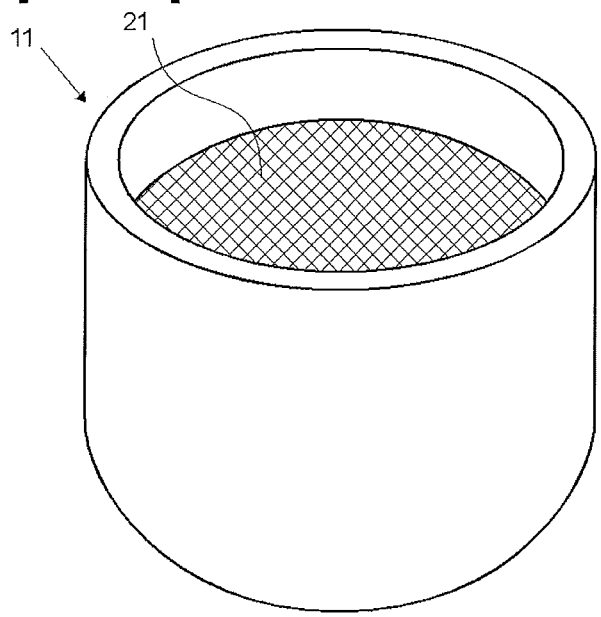

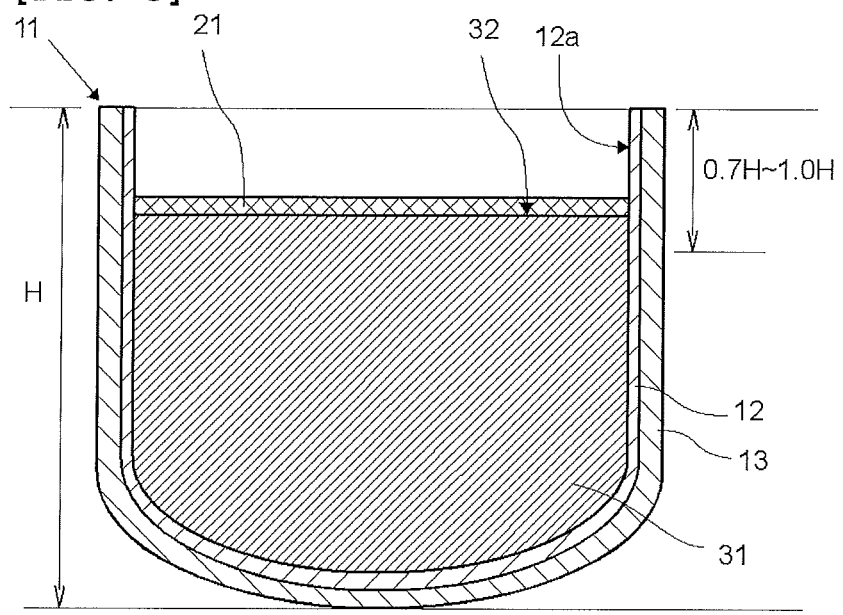

METHOD FOR PRODUCING A QUARTZ GLASS CRUCIBLE HAVING A ROUGHENED INNER SURFACE REGION FOR PULLING SINGLE CRYSTAL SILICON

TECHNICAL FIELD

The present invention relates to a quartz glass crucible for pulling a single crystal silicon and a method for producing the same.

BACKGROUND ART

Conventionally, the so called Czochralski method has been widely adopted for producing a single crystal material such as a single crystal semiconductor material. This is a method in which polycrystalline silicon is melted in a container, and an end of a seed crystal is dipped into the melt bath (melt) and is pulled with rotation. In this method, a single crystal grows under the seed crystal with having the same crystal orientation. In pulling of a single crystal silicon, a quartz glass crucible is generally used for the container from which the single crystal is pulled.

When polysilicon is melted in a quartz glass crucible to pull a single crystal silicon, there partially occurs a brown circular crystal called brown ring on the inner surface of the quartz glass crucible, which is amorphous. This brown ring is partial and very thin, thereby being liable to exfoliate during pulling of a single crystal silicon. This exfoliated piece can be incorporated into the single crystal silicon ingot to be pulled to lower the crystallinity of the single crystal silicon as a common phenomenon that occurs generally.

To solve the foregoing problem, for example, Patent Document 1 discloses an art in which a crystallization promoting agent is added into the inner surface of a crucible to crystallize the whole region of the inner surface of the crucible, thereby improving the strength of the crucible while suppressing the generation of a brown ring. In this art, however, impurities contained in the crystallization promoting agent are incorporated into the single crystal silicon to lower the crystallinity.

CITATION LIST

Patent Literature

Patent Document 1: Japanese Patent publication No. 3046545.

SUMMARY OF INVENTION

Technical Problem

The present invention was accomplished in view of the above-described problems. It is an object of the present invention to provide a quartz glass crucible for pulling a single crystal silicon which can effectively suppress the generation of a brown ring on the inner surface of the crucible in pulling a single crystal silicon to suppress crystallinity disorder of the single crystal silicon and a method for producing the same.

Solution to Problem

To solve the foregoing problems, the present invention provides a method for producing a quartz glass crucible for pulling a single crystal silicon from a silicon melt held therein, including the steps of:

producing a quartz glass crucible having an outer layer including an opaque quartz glass containing bubbles therein and an inner layer including a transparent quartz glass containing substantially no bubbles;

roughening a region of an inner surface of the produced quartz glass crucible, the region being in contact with the silicon melt when holding the silicon melt; and heating the quartz glass crucible having the roughened inner surface to crystallize a surface of the roughened region.

Such a method for producing a quartz glass crucible makes it possible to produce a quartz glass crucible which has a crystallized roughened region in the inner surface. Having the crystallized roughened region, it is possible to suppress generation of a brown ring and to suppress crystallinity disorder (generation of dislocation) of a single crystal silicon. This does not contain a crystallization promoting agent and so on for crystallization of the inner surface, thereby being free from elution of impurities contained in the crystallization promoting agent into a silicon melt.

In this case, it is preferable that the roughening form the roughened region having an arithmetic mean roughness of 0.1 μm or more and 3.0 μm or less.

By forming the rough surface with a roughness in such a range, the inner surface of a quartz glass crucible can be crystallized more surely in the next step of heating.

It is also preferable that the whole of the inner surface of the quartz glass crucible be roughened in the step of roughening.

By roughening the whole surface of the inner surface of the quartz glass crucible as described above, it is possible to crystallize the whole surface of the inner surface of the quartz glass crucible by the subsequent heating. This can make the inner surface to be in contact with a silicon melt be a crystallized roughened region more surely.

Preferably, the roughening is performed by blast treatment using quartz powder. In this case, the blast treatment can be performed by a dry process or a wet process.

Such a roughening method can simply form a roughened surface without incorporating unnecessary impurities.

Preferably, the heating is performed at a treatment temperature of 1000° C. or more and 1500° C. or less. It is also preferable that the heating be performed for a treatment time of 0.5 hour or more and 48 hours or less.

The heating at such a treatment temperature and a treatment time can crystallize the roughened region more surely.

The present invention also provides a quartz glass crucible for pulling a single crystal silicon from a silicon melt held therein, including:

an outer layer including an opaque quartz glass containing bubbles therein, and an inner layer including a transparent quartz glass containing substantially no bubbles, wherein a region of an inner surface of the quartz glass crucible is roughened, the region being in contact with the silicon melt when holding the silicon melt, and the roughened region being crystallized by heating.

Such a quartz glass crucible having a crystallized roughened region can suppress generation of a brown ring in pulling a single crystal silicon, and can suppress crystallinity disorder of a single crystal silicon. This quartz glass crucible does not contain a crystallization promoting agent and so on for crystallizing the inner surface, thereby being free from elution of impurities contained in the crystallization promoting agent into a silicon melt.

In this case, the roughened region preferably has an arithmetic mean roughness of 0.1 µm or more and 3.0 µm or less.

Having a roughness of the rough surface in such a range, the inner surface of a quartz glass crucible can be crystallized more surely.

It is also preferable that the whole of the inner surface of the quartz glass crucible be roughened, with the roughened region being crystallized by heating.

By roughening and crystallizing the whole of the inner surface of a quartz glass crucible as described above, it is possible to make the inner surface to be in contact with a silicon melt be a crystallized roughened region more surely.

Preferably, the roughened region is roughened by blast treatment using quartz powder.

The roughening by such a method can bring a roughened region without incorporating unnecessary impurities.

Advantageous Effects of Invention

The inventive quartz glass crucible for pulling a single crystal silicon has a crystallized roughened region, which can suppress generation of a brown ring in pulling a single crystal silicon, and can suppress crystallinity disorder of a single crystal silicon. This quartz glass crucible does not contain a crystallization promoting agent for crystallizing the inner surface and so on, and does not elute impurities contained in the crystallization promoting agent into a silicon melt thereby. Accordingly, a high quality silicon single crystal can be obtained. Such a quartz glass crucible can be produced by the method for producing a quartz glass crucible for pulling a single crystal silicon of the present invention.

BRIEF DESCRIPTION OF DRAWINGS

FIG. 1 is a schematic sectional view showing an example of the quartz glass crucible for pulling a single crystal silicon of the present invention;

FIG. 2 is a perspective view showing an example of the quartz glass crucible for pulling a single crystal silicon of the present invention;

FIG. 3 is a schematic sectional view showing a state of holding a silicon melt in the quartz glass crucible for pulling a single crystal silicon of the present invention.

DESCRIPTION OF EMBODIMENTS

As described above, when polysilicon is melted in a quartz glass crucible to pull a single crystal silicon, the inner surface of the quartz glass crucible, which is amorphous, is phase-transferred into a crystal. In the phase transition, crystallinity disorder of the silicon single crystal has been a frequently occurring phenomenon.

On coping with this problem, the foregoing method of using a crystallization promoting agent for the inner surface of a quartz glass crucible can suppress generation of a brown ring, but have a problem of incorporation of impurities of the crystallization promoting agent into the single crystal silicon. The inventors have diligently investigated to suppress the incorporation of the impurities.

The crystallization of a quartz glass crucible proceeds in a circumferential direction with time from a crack or an impurity as a starting point. The inventors have conceived that roughening and heating make the inner surface of a quartz glass crucible raise the speed of phase transition of the quartz glass into a crystal, thereby changing the phase of the inner surface of the quartz glass crucible to a crystal before pulling a single crystal silicon. The inventors have also find that this can suppress crystallinity disorder of a single crystal silicon without adding impurities, thereby brought the present invention completion.

Hereinafter, the present invention will be described more specifically with referring to the figures.

FIG. 1 shows a schematic sectional view showing an example of the quartz glass crucible of the present invention. FIG. 2 is a perspective view of the inventive quartz glass crucible shown in FIG. 1. The quartz glass crucible 11 has an outer layer 13 including an opaque quartz glass containing bubbles therein, and an inner layer 12 including a transparent quartz glass containing substantially no bubbles. The inventive quartz glass crucible is used for pulling a single crystal silicon from a melt of silicon (a silicon melt) held therein. The quartz glass crucible 11 has an inner surface 12a (i.e., the inner surface of the inner layer 12) on which at least a region being in contact with the silicon melt when holding the silicon melt is roughened, and the roughened region is crystallized by heating. In FIG. 1, the crystallized roughened region is shown by a reference number 21.

Incidentally, the quartz glass crucible 11 is composed of a bottom portion, a curved portion, and a straight body portion. The straight body portion refers to a portion of a substantially cylindrical shape in a crucible shape. The region between the straight body portion and the bottom portion is referred to as the curved portion. The bottom portion of a crucible can be defined as a portion having a diameter of about two-thirds of the outer diameter of the crucible, for example. The height of the straight body portion can be defined as the upper portion including three-quarters of the height of the crucible, for example, although it depends on the shape of the crucible. The thicknesses of the inner layer 12 and the outer layer 13 can be the same as the thickness of a commonly used quartz glass crucible, and are not particularly limited. For example, the thickness of the inner layer 12 can be 1.5 mm or more, but it may be thinner. Generally, the inner layer 12 is formed from high-purity quartz glass since it is in contact with a silicon melt directly, and the outer layer 13 is made lower-purity than the inner layer 12 in view of keeping the strength of the crucible and the cost.

In the inventive quartz glass crucible 11, since a crystallized roughened region 21 is formed on the inner surface 12a, generation of a brown ring can be suppressed, and crystallinity disorder of a single crystal silicon can be suppressed. This quartz glass crucible 11 does not contain a crystallization promoting agent for crystallization of the inner surface, etc., thereby being free from elution of impurities contained in the crystallization promoting agent into a silicon melt.

In the inventive quartz glass crucible 11, as described above, a region being in contact with a silicon melt when holding the silicon melt is roughened, and the roughened region is crystallized by heating. FIG. 3 is a schematic sectional view showing a state of holding a silicon melt (before pulling a single crystal silicon) in the inventive quartz glass crucible for pulling a single crystal silicon. In the quartz glass crucible 11, a silicon melt 31 is held, and a single crystal silicon is pulled from the silicon melt 31. The "region being in contact with a silicon melt when holding the silicon melt" refers to a portion of the inner surface 12a of the quartz glass crucible, which region is in contact with the silicon melt 31 in a state when the quartz glass crucible 11 contains the silicon melt 31 before pulling the single crystal silicon. Accordingly, the upper end of the crystallized roughened region 21 is set to a position which is the same as a melt surface 32 of the silicon melt 31 or higher. FIG. 3 shows a case in which the upper end of the crystallized roughened region 21 is set to a position higher than the melt surface 32. The melt surface 32 shown in FIG. 3 is a melt surface of the silicon melt in the initial stage before pulling a single crystal silicon. Since the melt surface 32 lowers as the pulling proceeds, it is the crystallized roughened region 21 that is directly in contact with the silicon melt 31, which is not in contact with a region above the upper end of the crystallized roughened region 21.

As described above, in the inventive quartz glass crucible 11, the crystallized roughened region 21 have to be set such that the position of the initial melt surface of the silicon melt 31 is in a range of the roughened surface. The position of the crystallized roughened region 21 of the quartz glass crucible 11 at this time can be appropriately set based on the diameter or production conditions of the quartz glass crucible 11, etc. Particularly, it is preferable that the upper end of the crystallized roughened region 21 is formed in a range of a height of 0.7×H to 1.0×H when the height of the quartz glass crucible 11 from the center point of the outer surface of the bottom portion to the upper end of the straight body portion is set to H (see FIG. 3). As shown in FIG. 3, the height H is a height measured from the outer surface of the bottom portion of the quartz glass crucible 11.

Particularly in this case, it is possible to form the crystallized roughened region 21 onto the whole surface of the inner surface 12a of the quartz glass crucible. By this procedure, the inner surface of the crucible to be in contact with a silicon melt can be a crystallized roughened region more surely even when the amount of the silicon melt is changed or the surface of the silicon melt is shaken.

In the crystallized roughened region 21, it is preferable that the roughened region have an arithmetic mean roughness of 0.1 µm or more and 3.0 µm or less. When the region is roughened to the arithmetic mean roughness of 3.0 µm or less, it is possible to suppress generation of exfoliated pieces from the quartz glass crucible and to promote the crystallization of the roughened region more surely. On the other hand, it is preferable to have an arithmetic mean roughness of 0.1 µm or more in order to achieve the effect of roughening more surely.

It is also preferable that the crystallized roughened region 21 is roughened by blast treatment using quartz powder. Such a method for forming a roughened surface can simply form a roughened surface without incorporating unnecessary impurities.

In the following, a method for producing a quartz glass crucible which can produce such a quartz glass crucible 11 will be described.

First, a quartz glass crucible having an outer layer including an opaque quartz glass containing bubbles therein and an inner layer including a transparent quartz glass containing substantially no bubbles is produced (step a). The quartz glass crucible produced in this step can be produced by a well-known method.

Then, a region of the inner surface of the quartz glass crucible produced in step a, the region being in contact with a silicon melt when holding the silicon melt, is roughened (step b). The "region being in contact with a silicon melt when holding the silicon melt" has the same meaning as described above.

In this step b, it is preferable to form the roughened region having an arithmetic mean roughness of 0.1 µm or more and 3.0 µm or less. By forming a roughened surface having the roughened region in such a range, it is possible to crystallize the inner surface of the quartz glass crucible more surely in the next step c.

The roughening in this step b is preferably performed by blast treatment using quartz powder. As the quartz powder used for the blast treatment, synthetic quartz powder or high-purity natural quartz powder can be used. The blast treatment is a procedure in which quartz powder is sprayed by compressed air or centrifugal force to form a roughened surface onto the inner surface of the quartz glass crucible 11. The blast treatment may be a dry blast to spray quartz powder or may be a wet process to spray quartz powder with a fluid such as water. The quartz powder preferably contains quartz powder having a particle size in a range of 106 µm to 355 µm in a cumulative weight of 80% or more. For measuring and selecting the particle size, sieves can be used, for example. By roughening in such a method, a roughened surface can be simply formed without incorporating unnecessary impurities.

Then, the quartz glass crucible with the inner surface being roughened in the step b is heated to crystallize the surface of the roughened region (step c). The surface roughening can promote crystallization of the region to be in contact with a silicon melt. In the inventive method for producing a quartz glass crucible, heating is essential after roughening of the inner surface and before being in contact with a silicon melt. Only with roughening of the inner surface, the crystallization is insufficient, and accordingly, a brown ring occurs in pulling of a single crystal silicon. For judging whether the crystallization is achieved or not by heating, for example, the crystallization level of the inner surface can be confirmed by X-rai diffraction. In this case, it is also possible to prepare a crucible for evaluation by X-ray diffraction which is produced and subjected to roughening and heating in the same condition as in a crucible used in a practical pulling of a single crystal silicon.

This heating is preferably performed at a treatment temperature of 1000° C. to 1500° C. for a treatment time of 0.5 hour to 48 hours. By heating in these ranges of temperature and time, the roughened surface can be crystallized more surely. The treatment temperature of 1000° C. or more enables an effect of promoting crystallization of the quartz glass crucible to be sufficient. The treatment temperature of 1500° C. or less can ensure the viscosity of the quartz glass crucible to prevent deformation of the quartz glass crucible due to lowering of the viscosity. As for the treatment time, similarly to the temperature, 0.5 hour or more enables an effect of promoting crystallization to be sufficient, and 48 hours or less can prevent deformation of the quartz glass crucible.

In the inventive method for producing a quartz glass crucible, the inner surface is crystallized by heating from the roughened surface formed thereon as a starting point, and a quartz glass crucible having the crystallized inner surface (the quartz glass crucible 11 in FIG. 1) can be produced thereby. By pulling a single crystal silicon using this quartz glass crucible, it is possible to suppress generation of a brown ring on the inner surface of the crucible during the pulling, and to suppress crystallinity disorder of the single crystal silicon. Accordingly, it is possible to markedly improve the productivity of a silicon single crystal. It does not contain a crystallization promoting agent for crystallizing the inner surface, etc., thereby being free from elution of the crystallization promoting agent as an impurity into the silicon melt. Therefore, it is possible to improve the quality of a silicon single crystal to be produced, and to markedly improve the yield.

It is to be noted that the present invention can be applied to crucibles with various opening diameters, and the opening diameter of a crucible is not particularly limited.

EXAMPLE

Hereinafter, the present invention will be described in more detail based on Examples and Comparative Examples, but the present invention is not limited thereto, and it is no doubt that various modifications can be carried out unless deviating from the technical concept of the present invention.

Example 1

The quartz glass crucible 11 for pulling a single crystal silicon shown in FIG. 1 to FIG. 3 was produced through the following steps.

First, natural quartz powder with particle sizes of 50 to 500 µm was supplied into a rotating mold with an inner diameter of 570 mm to form a molding including a powder layer with a thickness of 25 mm to be an outer layer. Then, while the molding was heated to melt from the inside thereof by arc discharge, synthetic quartz powder was supplied into the high temperature atmosphere at a rate of 100 g/minute to form a transparent glass layer (an inner layer) containing no bubbles in a thickness of 1 to 3 mm over the whole inner surface region. After finishing the melting, a quartz glass crucible with a diameter of 555 to 560 mm was obtained through cooling. The upper end portion of this quartz glass crucible was cut off so as to make the height H (the height from the center of the outer surface of the bottom portion to the upper end of the straight body portion) be 370 mm to produce a quartz glass crucible (step a).

Then, in the inner surface of this produced quartz glass crucible, a roughened region having an arithmetic mean roughness of 0.1 µm was formed by blast treatment with quartz powder (step b). The treatment for forming a roughened surface was performed onto the inner wall surface in a state that the quartz glass crucible was upside-down so as to turn the opening of the upper end to downward. On the high-purity natural quartz powder used as the blast material, the particle size distribution was measured to find that the 87% by mass was in a particle size of 106 µm to 355 µm. The roughened region was formed on the whole of the inner surface of the quartz glass crucible.

The quartz glass crucible with the inner surface being roughened was subjected to heating at 1200° C. for 12 hours to obtain a quartz glass crucible 11 (step c). By the same conditions as in the foregoing, a quartz glass crucible was prepared and subjected to the same treatments for forming a roughened surface and heating to prepare a crucible for evaluation, and this was put to X-ray diffraction to verify that the roughened region in the inner surface had been crystallized.

Then, by using the quartz glass crucible 11 thus produced, a single crystal silicon was pulled to reveal that the single crystal was produced in a better yield compared to Comparative Examples (described below), which did not perform surface roughening and subsequent heating of the present invention.

Example 2

As Example 1, a quartz glass crucible 11 was produced by altering the heating conditions to 1000° C. for 0.5 hour. By using this quartz glass crucible 11, a single crystal silicon was pulled in the same manner as in Example 1 to reveal that the yield of the single crystal was largely improved compared to Comparative Example 1 but slightly declined compared to Example 1. This was probably due to the lower treatment temperature and the shorter treatment time compared to Example 1, which lowered the extent of crystallization of the roughened region of the inner surface compared to Example 1.

Example 3

As Example 1, a quartz glass crucible 11 was produced by altering the arithmetic mean roughness of the inner surface to 1.0 µm, and the heating temperature to 1000° C. By using this quartz glass crucible 11, a single crystal silicon was pulled in the same manner as in Example 1 to reveal that the single crystal was produced in a good yield.

Example 4

As Example 1, a quartz glass crucible 11 was produced by altering the arithmetic mean roughness of the inner surface to 1.0 µm, and the having time to 24 hours. By using this quartz glass crucible 11, a single crystal silicon was pulled in the same manner as in Example 1 to reveal that the single crystal was produced in a good yield.

Example 5

As Example 1, a quartz glass crucible 11 was produced by altering the arithmetic mean roughness of the inner surface to 2.0 µm, and the heating time to 48 hours. By using this quartz glass crucible 11, a single crystal silicon was pulled in the same manner as in Example 1 to reveal that the single crystal was produced in a good yield.

Example 6

As Example 1, a quartz glass crucible 11 was produced by altering the arithmetic mean roughness of the inner surface to 3.0 µm, and the heating temperature to 1000° C. By using this quartz glass crucible 11, a single crystal silicon was pulled in the same manner as in Example 1 to reveal that the single crystal was produced in a good yield.

Example 7

As Example 1, a quartz glass crucible 11 was produced by altering the arithmetic mean roughness of the inner surface to 3.0 µm, and the heating conditions to 1500° C. for 1 hour. By using this quartz glass crucible 11, a single crystal silicon was pulled in the same manner as in Example 1 to reveal that the yield of the single crystal was improved compared to Comparative Example 1 but slightly declined compared to Example 1. This was probably due to the high heating temperature, which lowered the viscosity of the quartz glass crucible to deform the quartz glass crucible itself.

Example 8

As Example 5, a quartz glass crucible 11 was produced by altering the heating conditions to 900° C. for 12 hours. By using this quartz glass crucible 11, a single crystal silicon was pulled in the same manner as in Example 1 to reveal that the single crystal was produced in a yield which was improved compared to Comparative Example 1 but slightly declined compared to Example 1. This was probably due to the low treatment temperature, which lowered the crystallinity of the roughened region of the inner surface of the quartz glass crucible, thereby generating a small amount of brown ring on the inner surface of the quartz glass crucible during pulling the single crystal silicon, and this was exfoliated and incorporated into the single crystal silicon to lower the crystallinity.

Example 9

As Example 5, a quartz glass crucible 11 was produced by altering the heating time to 60 hours. By using this quartz glass crucible 11, a single crystal silicon was pulled in the same manner as in Example 1 to reveal that the single crystal was produced in a yield which was improved compared to Comparative Example 1 but slightly declined compared to Example 1. This was probably due to the long heating time, which lowered the viscosity of the quartz glass crucible to deform the quartz glass crucible itself.

Example 10

As Example 1, a quartz glass crucible 11 was produced by altering the arithmetic mean roughness of the inner surface to 4.0 μm. By using this quartz glass crucible 11, a single crystal silicon was pulled in the same manner as in Example 1 to reveal that the single crystal was produced in a yield which was improved compared to Comparative Example 1 but slightly declined compared to Example 1. This was probably due to the roughened region of the inner surface, which was rough and partially generated exfoliated pieces during pulling the single crystal silicon, and these were incorporated into the silicon single crystal to lower the crystallinity.

Comparative Example 1

A quartz glass crucible for pulling a single crystal silicon was produced through the following steps. First, natural quartz powder with particle sizes of 50 to 500 μm was supplied into a rotating mold with an inner diameter of 570 mm to form a molding including a powder layer with a thickness of 25 mm to be an outer layer. Then, while the molding was heated to melt from the inside thereof by arc discharge, synthetic quartz powder was supplied into the high temperature atmosphere at a rate of 100 g/minute to form a transparent glass layer (an inner layer) containing no bubbles in a thickness of 1 to 3 mm over the whole inner surface region. After finishing the melting, a quartz glass crucible with a diameter of 555 to 560 mm was obtained through cooling. The upper end portion of this quartz glass crucible was cut off so as to have the height H (the height from the center of the outer surface of the bottom portion to the upper end of the straight body portion) being 370 mm to produce a quartz glass crucible. This quartz glass crucible was not subjected to formation of a roughened region of an inner surface nor heat treatment as in Examples 1 to 10.

Then, by using the quartz glass crucible thus produced, a single crystal silicon was pulled. The single crystal was produced in a largely declined and unsatisfactory yield. This was probably due to a brown ring, which was generated on the inner surface of the quartz glass crucible during pulling a single crystal silicon, exfoliated, and was incorporated into the single crystal silicon to lower the crystallinity.

Comparative Example 2

First, a quartz glass crucible was produced as in Comparative Example 1. To this quartz glass crucible, a roughened region of the inner surface as in Examples 1 to 10 was not formed. This quartz glass crucible was subjected to heating at 1200° C. for 12 hours to produce a quartz glass crucible. By using this quartz glass crucible, a single crystal silicon was pulled to reveal that the single crystal was produced in a largely declined and unsatisfactory yield. This was probably due to insufficient crystallinity of the inner surface of the crucible even after the heating since a roughened surface had not been formed on the inner surface of the quartz glass crucible, thereby generating a brown ring on the inner surface of the quartz glass crucible during pulling the single crystal silicon, which brown ring was exfoliated and incorporated into the single crystal silicon to lower the crystallinity.

Comparative Example 3

A quartz glass crucible was produced in the same manner as in Comparative example 1, and then the whole surface of the inner surface was roughened. The quartz glass crucible was produced as Comparative Example 1 with altering the arithmetic mean roughness of the inner surface to 4.0 μm. By using this quartz glass crucible, a single crystal silicon was pulled to reveal that the single crystal was produced in a largely declined yield. This was probably due to the roughened region of the inner surface, which was rough and was not crystallized by previous heating, and a lot of exfoliated pieces were generated during the pulling of the single crystal silicon thereby, and these were incorporated into the silicon single crystal to lower the crystallinity.

Table 1 summarizes the arithmetic mean roughness and the heating conditions of the quartz glass crucibles, as well as the results of pulling single crystal silicon in Examples 1 to 10 and Comparative Examples 1 to 3. In the table, the expression of "excellent" indicates a very good result, the expression of "fair" indicates that the result was in a level without problem, and the expression of "bad" indicates a bad result.

TABLE 1

| | Arithmetic mean roughness of inner surface (μm) | Heating temperature (° C.) | Heating time (hour) | Crystallinity of single crystal silicon |
|---|---|---|---|---|
| Example 1 | 0.1 | 1200 | 12 | Excellent |
| Example 2 | 0.1 | 1000 | 0.5 | Fair |
| Example 3 | 1.0 | 1000 | 12 | Excellent |
| Example 4 | 1.0 | 1200 | 24 | Excellent |
| Example 5 | 2.0 | 1200 | 48 | Excellent |
| Example 6 | 3.0 | 1000 | 12 | Excellent |
| Example 7 | 3.0 | 1500 | 1 | Fair |
| Example 8 | 2.0 | 900 | 12 | Fair |
| Example 9 | 2.0 | 1200 | 60 | Fair |
| Example 10 | 4.0 | 1200 | 12 | Fair |
| Comparative Example 1 | 0.0 | — | — | Bad |
| Comparative Example 2 | 0.0 | 1200 | 12 | Bad |
| Comparative Example 3 | 4.0 | — | — | Bad |

From the results of Examples 1 to 10 and Comparative Examples 1 to 3, it turned out that high yield of a single crystal silicon can be achieved by subjecting the inner surface of a quartz glass crucible to formation of a roughened region and heating.

The invention claimed is:

1. A method for producing a quartz glass crucible for pulling a single crystal silicon from a silicon melt held therein, comprising:
   producing a quartz glass crucible having an outer layer comprising an opaque quartz glass containing bubbles therein and an inner layer comprising a transparent quartz glass;
   roughening a region of an inner surface of the produced quartz glass crucible by blast treatment using quartz powder, the region being in contact with the silicon melt when holding the silicon melt; and
   heating the quartz glass crucible having the roughened inner surface before being in contact with the silicon melt to crystallize a surface of the roughened region, the roughened inner surface being roughened by the blast treatment using the quartz powder,
   wherein the entire roughening of the region of the inner surface of the produced quartz glass crucible is by blast treatment using quartz powder.

2. The method for producing a quartz glass crucible for pulling a single crystal silicon according to claim 1, wherein the roughening forms the roughened region having an arithmetic mean roughness of 0.1 μm or more and 3.0 μm or less.

3. The method for producing a quartz glass crucible for pulling a single crystal silicon according to claim 1, wherein the whole of the inner surface of the quartz glass crucible is roughened in the step of roughening.

4. The method for producing a quartz glass crucible for pulling a single crystal silicon according to claim 2, wherein the whole of the inner surface of the quartz glass crucible is roughened in the step of roughening.

5. The method for producing a quartz glass crucible for pulling a single crystal silicon according to claim 1, wherein the blast treatment is performed by a dry process or a wet process.

6. The method for producing a quartz glass crucible for pulling a single crystal silicon according to claim 1, wherein the heating is performed at a treatment temperature of 1000° C. or more and 1500° C. or less.

7. The method for producing a quartz glass crucible for pulling a single crystal silicon according to claim 1, wherein the heating is performed for a treatment time of 0.5 hours or more and 48 hours or less.

8. A method for producing a quartz glass crucible for pulling a single crystal silicon from a silicon melt held therein, comprising:
   producing a quartz glass crucible having an outer layer comprising an opaque quartz glass containing bubbles therein and an inner layer comprising a transparent quartz glass;
   roughening a region of an inner surface of the produced quartz glass crucible by blast treatment using quartz powder, the region being in contact with the silicon melt when holding the silicon melt; and
   heating the quartz glass crucible having the roughened inner surface before being in contact with the silicon melt to crystallize a surface of the roughened region, the roughened inner surface being roughened by the blast treatment using the quartz powder,
   wherein the heating of the quartz glass crucible having the roughened inner surface to crystallize the surface of the roughened region is performed immediately after the roughening of the region of the inner surface of the produced quartz glass crucible by blast treatment using quartz powder.

* * * * *